(12) United States Patent
Mani (10) Patent No.: US 8,565,012 B1
(45) Date of Patent: Oct. 22, 2013

(54) MAGNETIC ENHANCEMENT LAYER IN MEMORY CELL

(75) Inventor: Krishnakumar Mani, San Jose, CA (US)

(73) Assignee: Magsil Corporation, Santa Clara, CA (US)

( * ) Notice: Subject to any disclaimer, the term of this patent is extended or adjusted under 35 U.S.C. 154(b) by 123 days.

(21) Appl. No.: 13/153,474

(22) Filed: Jun. 6, 2011

(51) Int. Cl.
*G11C 11/00* (2006.01)
*G11C 11/06* (2006.01)
*G11C 11/14* (2006.01)

(52) U.S. Cl.
USPC ............... 365/158; 365/55; 365/66; 365/171

(58) Field of Classification Search
USPC .......................................... 365/66, 158, 171
See application file for complete search history.

(56) References Cited

U.S. PATENT DOCUMENTS

| | | | |
|---|---|---|---|
| 2006/0028862 A1* | 2/2006 | Min et al. | 365/158 |
| 2009/0219754 A1* | 9/2009 | Fukumoto | 365/158 |
| 2011/0116306 A1* | 5/2011 | Suzuki et al. | 365/158 |

* cited by examiner

*Primary Examiner* — Ly D Pham
(74) *Attorney, Agent, or Firm* — Hahn & Moodley LLP; Vani Moodley, Esq.

(57) ABSTRACT

Magnetic memory cell comprising two conductors and a magnetic storage element between the two conductors, wherein a magnetic enhancement layer (MEL) is provided in the proximity of at least along a partial length of at least one of the two conductors. The MEL is for enhancing a magnetic field in the element when the two conductors are energized. Methods for operation and fabrication process for the memory cell are also disclosed. The memory cell is particularly for use in magnetic random access memory (MRAM) circuits, when using magnetic tunnel junction (MTJ) stacks as the magnetic storage elements.

18 Claims, 6 Drawing Sheets

FIG.2C (a) After deposition of MEL (b) After maskless etch-back of MEL

FIG. 3

MAGNETIC ENHANCEMENT LAYER IN MEMORY CELL

FIELD

Embodiments of the invention relate to magnetic memory cells and in particular, to magnetic random access memory (MRAM) circuits.

BACKGROUND

Magnetic memory circuits are based on magneto-resistive behavior of magnetic storage elements that are integrated typically with a complementary metal-oxide-semiconductor (CMOS) technology. Such memory circuits generally provide non-volatility and an unlimited read and write capability. An example is the magnetic random access memory (MRAM) circuit that includes a plurality of memory cells, each defining an addressable magnetic storage element that may include a magnetic tunnel junction (MTJ) stack.

Each addressable MTJ stack can have a magnetic spin orientation and can be flipped between two states by the application of a magnetic field that is induced by energizing corresponding bit and word lines.

Figure 1A:
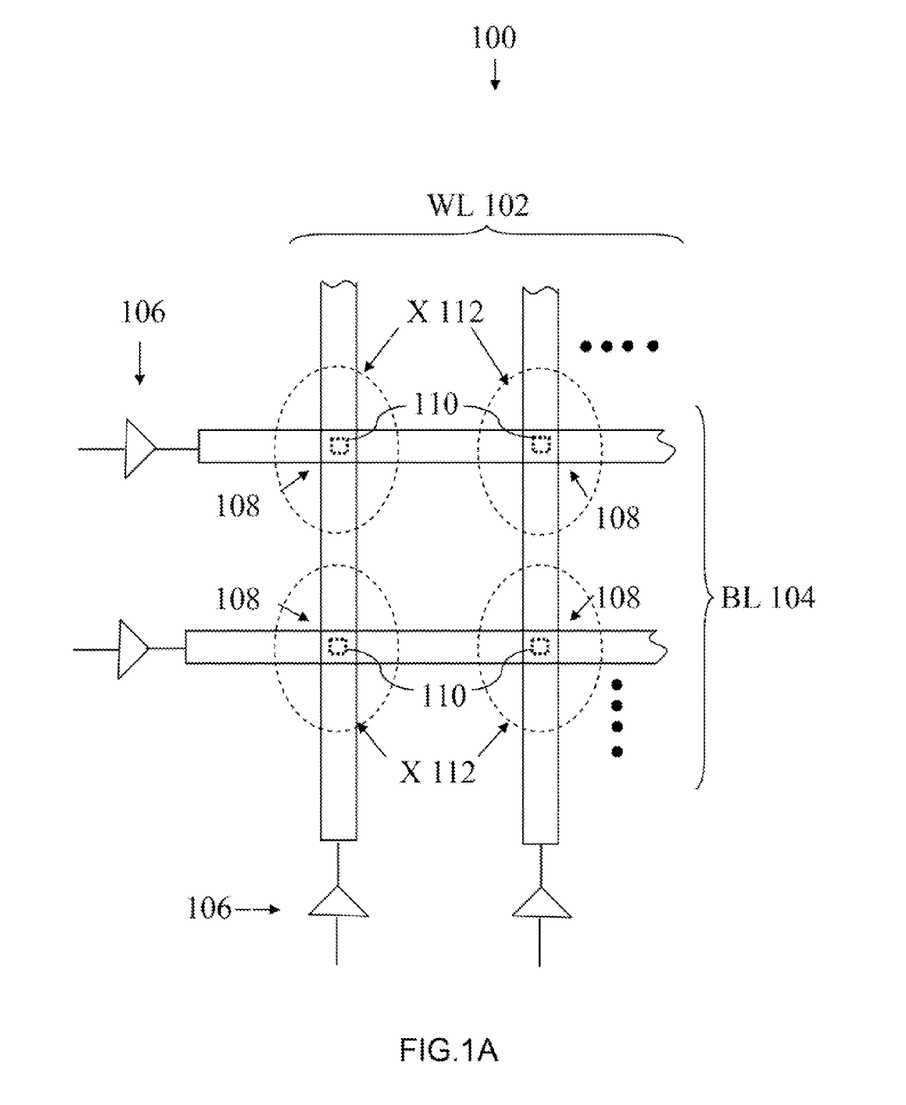
FIG. 1A illustrates a plan view of a section of an exemplary array of memory cells in a magnetic random access memory (MRAM) circuit.

FIG. 1A illustrates a plan view of a section of an exemplary array 100 of memory cells X 112 in an MRAM circuit, that includes a set of longitudinal word lines (WL) 102 and a set of transverse bit lines (BL) 104. The set of bit lines 104 overlies the set of word lines 102 to define crossover zones 108. An addressable MTJ stack 110 is disposed within each crossover zone 108. Current drivers 106 are provided for energizing the bit lines 104 and the word lines 102. An address transistor (not shown) is provided under each MTJ stack 110 and in the memory cell X 112, for reading the state of the MTJ stack 110.

Figure 1B:
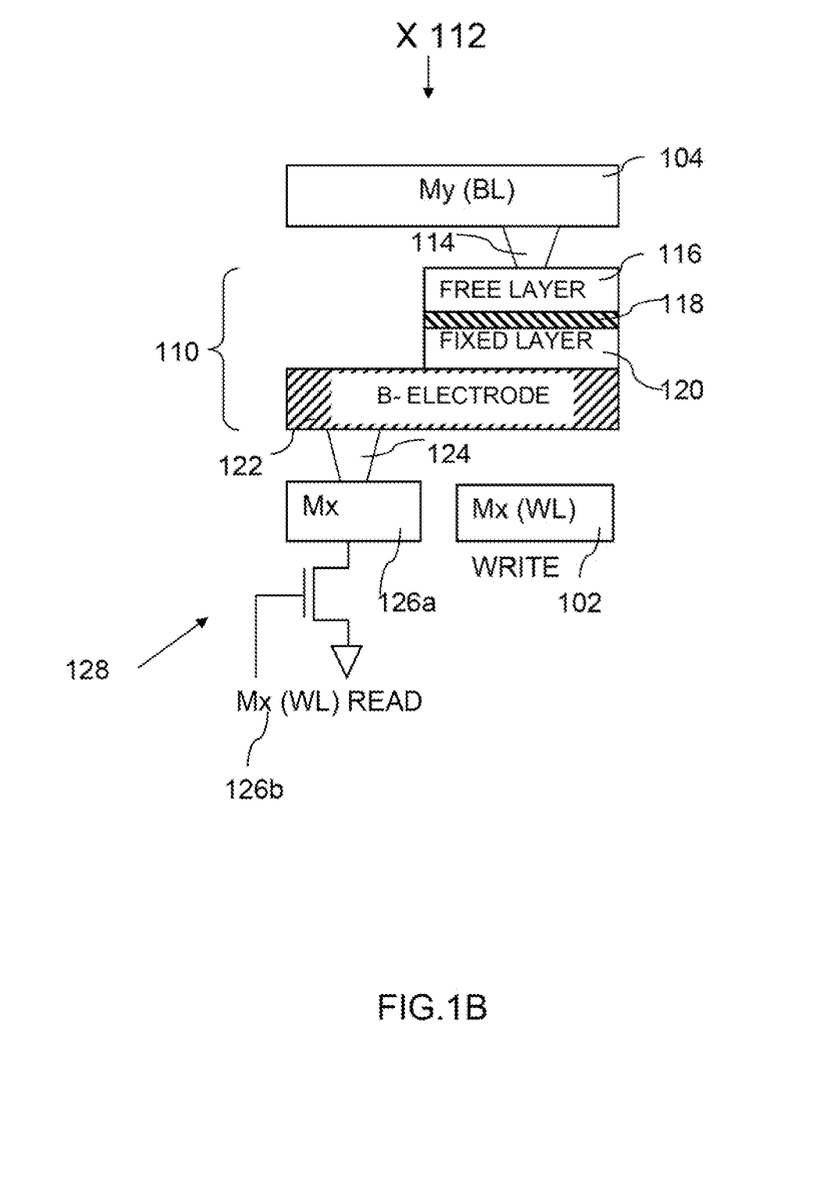
FIG. 1B illustrates a partly schematic and partly cross-sectional view of a memory cell described in FIG. 1A, with the memory cell including a magnetic tunnel junction (MTJ) stack.

FIG. 1B illustrates a partly schematic and partly cross-sectional view of the memory cell X 112 described in FIG. 1A, with the memory cell including an MTJ stack 110. The MTJ stack 110 is disposed within the crossover zone 108. The address transistor 128 is shown schematically. Generally, the MTJ stack 110 is designed to be integrated into a back-end metallization structure following a front-end CMOS processing. The MTJ stack 110 is shown to be provided between a first metallization layer Mx and a second metallization layer My, wherein the MTJ stack 110 is connected to the first layer Mx through a via hole 124 and to the second layer My through a via hole 114. The second layer My is patterned to include the bit line 104. The MTJ stack 110 includes a free layer 116, a tunnel oxide layer 118, a fixed layer 120 and an extended bottom electrode 122. The first layer Mx is patterned to include the word line 102 for writing into the MTJ stack 110. The address transistor 128 is connected to the first layer Mx by a connection 126a. A read word line (WL) 126b in the first layer Mx is usable for selectively operating the address transistor 128. The word line 102 has no contact with the bottom electrode 122, and when energized, induces a magnetic field within the MTJ stack 110.

A write operation in a selected memory cell X 112 in the array 100 can be performed by energizing the corresponding bit line 104 and the word line 102, to generate a magnetic field for changing the magnetic state of the corresponding MTJ stack 110. For a read operation, a voltage is applied to the bit line 104 of the selected memory cell X 112, so that a current can flow through the corresponding MTJ stack 110 and the address transistor 128 that is selectively switched on by the word line 126b. The magnitude of the current sensed indicates the conductivity or the magnetic state of the MTJ stack 110.

SUMMARY OF THE INVENTION

According to an embodiment of a first aspect of the invention, a magnetic memory cell comprises two conductors and a magnetic storage element disposed between the two conductors. A magnetic enhancement layer (MEL) is disposed proximate at least along a partial length of at least one of the two conductors, for enhancing a magnetic field in the element when the two conductors are energized.

According to an embodiment of the first aspect of the invention, the first conductor is a word line and the second conductor is a bit line.

According to another embodiment of the first aspect of the invention, at least one of the two conductors comprises aluminum.

According to another embodiment of the first aspect of the invention, the MEL is a stack of tantalum/nickel-iron/tantalum, wherein the nickel-iron is in any form that produces ferromagnetic properties.

According to another embodiment of the first aspect of the invention, the MEL comprises at least one of the following ferromagnetic materials: iron, cobalt, iron-cobalt, and nickel-iron, wherein iron-cobalt and nickel-iron are in any form that produce ferromagnetic properties.

According to another embodiment of the first aspect of the invention, the MEL comprises a first ferromagnetic material for the first conductor and a second ferromagnetic material for the second conductor.

According to another embodiment of the first aspect of the invention, a magnetic memory circuit comprises an array of the aforesaid memory cells.

According to another embodiment of the first aspect of the invention, the aforesaid memory circuit is a magnetic random access memory (MRAM) circuit.

According to another embodiment of the first aspect of the invention, the element is a magnetic tunnel junction (MTJ) stack.

According to another embodiment of the first aspect of the invention, the MEL is on opposite sides of the conductor(s).

According to an embodiment of a second aspect of the invention, a method of processing the memory cell is proposed. According to the method, an MEL is deposited to at least partially encapsulate either of the two conductors and masklessly etched back while retaining the MEL only at the two opposite sides.

According to an embodiment of a third aspect of the invention, a method of processing the aforesaid MRAM circuit is proposed. According to the method, the MEL is deposited to at least partially encapsulate either of the word and bit lines and masklessly etched back while retaining the MEL only at the two opposite sides.

According to an embodiment of a fourth aspect of the invention, a method is proposed for operating the aforesaid magnetic memory cell. The method comprises, enhancing a magnetic field that is induced in the element when the two conductors are energized. The enhancement is caused by using an MEL that is disposed proximate at least along a partial length of at least one of the two conductors.

According to an embodiment of a fifth aspect of the invention, a method is proposed for operating an MRAM circuit that comprises a first set of bit lines overlying a second set of word lines to define crossover zones and a magnetic tunnel junction (MTJ) stack that is disposed within each crossover zone. The method comprises enhancing a magnetic field that is induced in each MTJ stack when a corresponding pair of the word line and the bit line is selectively energized. The enhancement is by using an MEL that is disposed proximate at least along a partial length of the lines in at least one of the two sets.

The MEL enhances the induced magnetic field in the memory cell, for the write operation. This feature can advantageously be used to compensate a degradation in the magnetic field, due to the use of wider line widths for the word and bit lines processed with a simpler and cheaper technology.

DETAILED DESCRIPTION

In the following description, for purposes of explanation, numerous specific details are set forth in order to provide a thorough understanding of the invention. It will be apparent, however, to one skilled in the art that the invention can be practiced without these specific details.

Reference in this specification to "one embodiment" or "an embodiment" means that a particular feature, structure, or characteristic described in connection with the embodiment is included in at least one embodiment of the invention. The appearances of the phrase "in one embodiment" in various places in the specification are not necessarily all referring to the same embodiment, nor are separate or alternative embodiments mutually exclusive of other embodiments. Moreover, various features are described which may be exhibited by some embodiments and not by others. Similarly, various requirements are described which may be requirements for some embodiments but not other embodiments.

Broadly, embodiments of the invention disclose an addressable memory cell that is provided with two conductors like a word line and a bit line, further with a magnetic storage element in between the two lines. A magnetic enhancement layer (MEL) is provided in the proximity of at least along a partial length of at least one of the two conductors, for enhancing an induced magnetic field in the element during a write operation, when the two conductors are energized. According to an embodiment, the MEL is achieved on the opposite sides of the lines by a process of deposition and a maskless etch-back. An array of the memory cell according to the embodiment of the invention is usable in magnetic random access memory (MRAM) circuits. The element may be for example, a magnetic tunnel junction (MTJ) stack. Wider the write word line and the bit line, lower are the corresponding current densities and the corresponding induced magnetic fields, which are undesirable for the write operation into the memory cell. Hence, generally the write word line and the bit line are processed at fine geometries, though at increased cost. Advantageously, with the use of the MEL, the enhancement in the induced magnetic field could be used particularly, though not exclusively, to compensate its degradation due to the use of wider line widths for the write word line and the bit line. This approach can provide a low cost solution, where simpler and cheaper processing technology for wider line widths would suffice for the metallization layers that define the write word line and the bit line. For example, wider line width aluminum or aluminum alloy lines with the MEL may be used instead of fine line width copper lines.

Figure 2A:
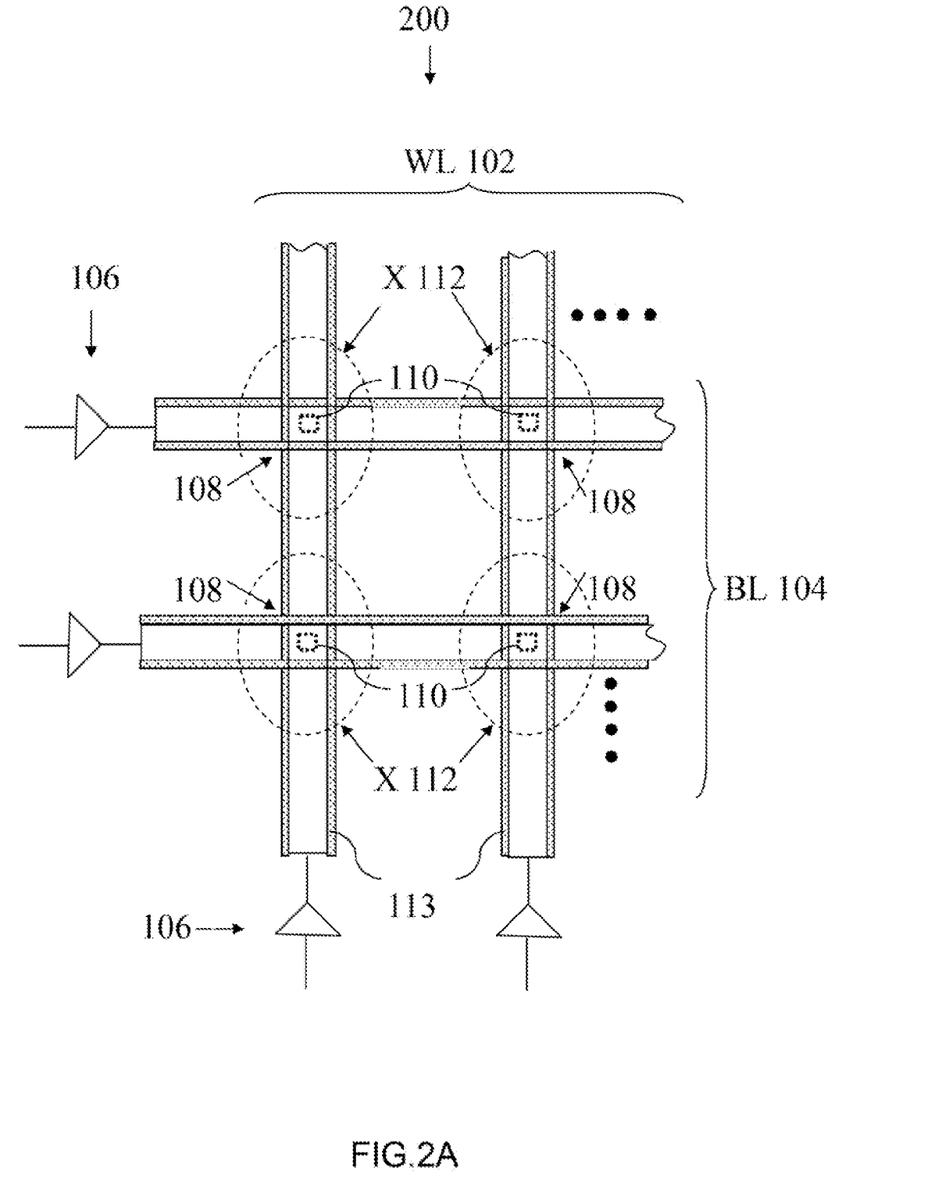
FIG. 2A illustrates a plan view of a section of an exemplary array of memory cells in a magnetic random access memory (MRAM) circuit, with the magnetic enhancement layer all along the lengths of the word and bit lines, according to an embodiment of the invention.
Figure 2B:
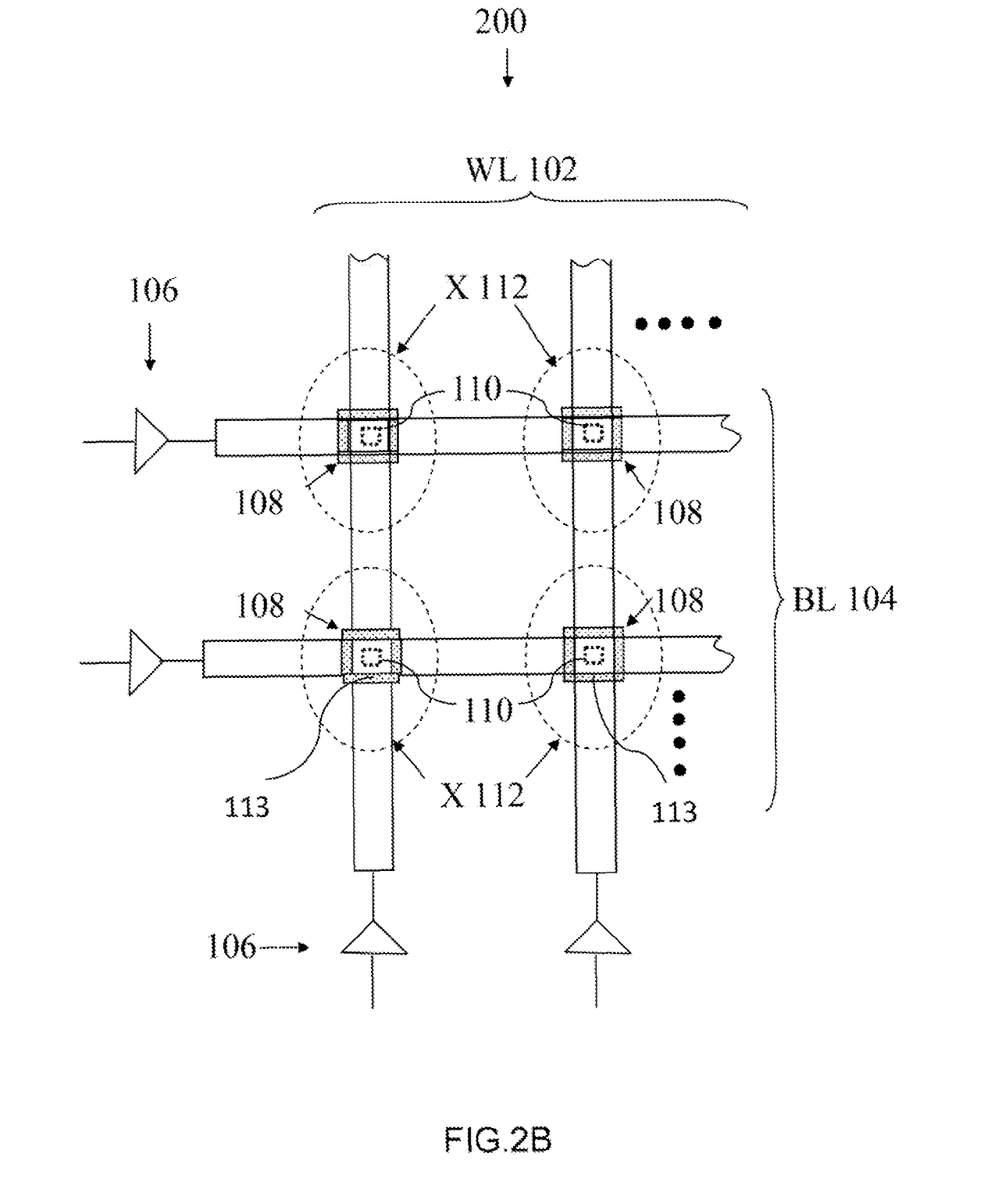
FIG. 2B illustrates a plan view of a section of an exemplary array of memory cells in a magnetic random access memory (MRAM) circuit, with the magnetic enhancement layer only along the lengths of the word and bit lines at the crossover zones, according to an embodiment of the invention.
Figure 2C:
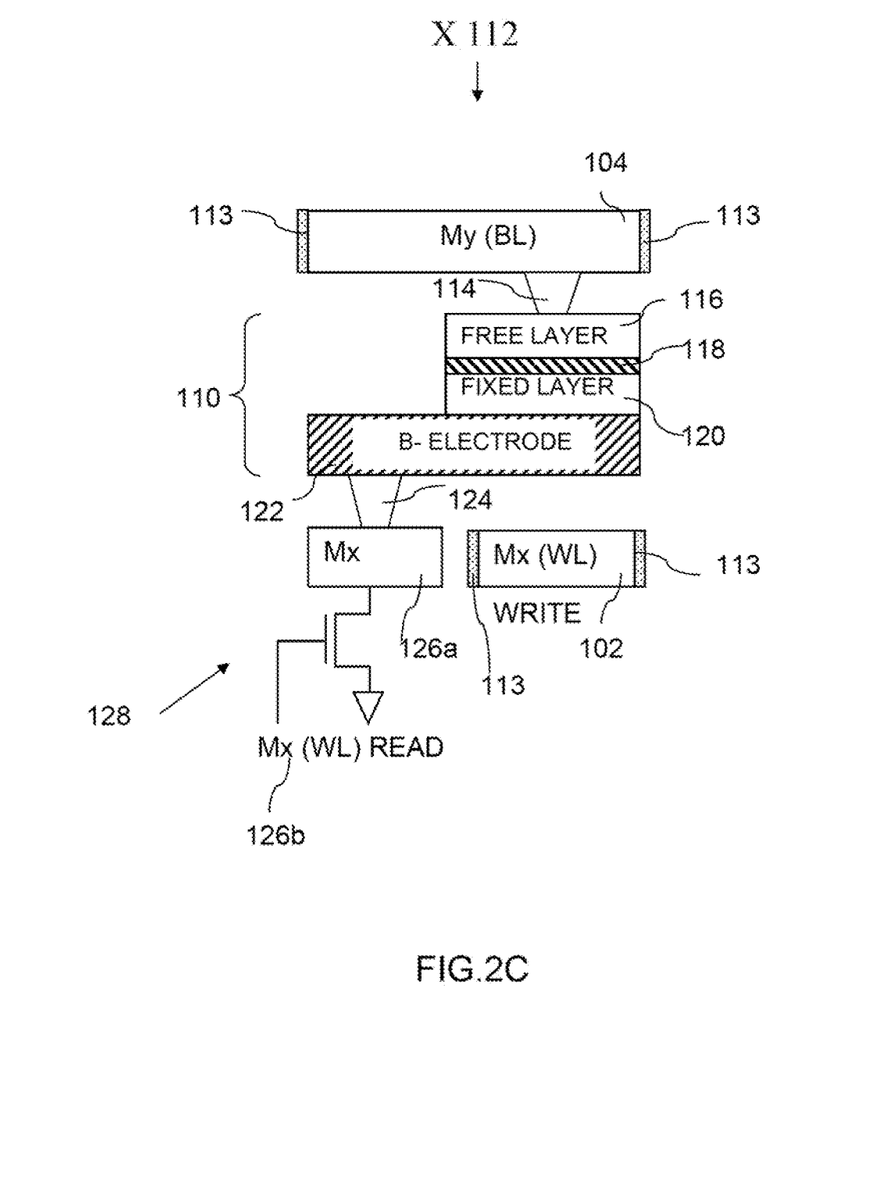
FIG. 2C illustrates a partly schematic and partly cross-sectional view of a memory cell described in FIG. 2A or 2B, with the memory cell including a magnetic tunnel junction (MTJ) stack, according to an embodiment of the invention.

Referring now to FIG. 2A of the drawings, there is shown a plan view of a section of an exemplary array 200 of the memory cells X 112 in a magnetic random access memory (MRAM) circuit. In this embodiment, the magnetic enhancement layer (MEL) 113 is all along the lengths of the word lines 102 and the bit lines 104. According to an alternate embodiment, FIG. 2B illustrates a plan view of a section of an exemplary array 200 of the memory cells X 112 in a magnetic random access memory (MRAM) circuit, with the MEL 113 only along the lengths of the word lines 102 and the bit lines 104 at the crossover zones 108. The embodiment at FIG. 2A is likely to have a stronger effect of magnetic enhancement than the embodiment at FIG. 2B. According to an embodiment of the invention, FIG. 2C illustrates a partly schematic and partly cross-sectional view of the memory cell X 112 described in FIGS. 2A and 2B, with the memory cell X 112 including a magnetic tunnel junction (MTJ) stack 110. The MEL 113 is shown to be on the two sides of the write word line 102 and the bit line 104. However, according to other embodiments (not shown), the top surface of the bit line 104 and/or the bottom surface of the write word line 102 are also covered with the MEL 113, for additional enhancement in the magnetic field. The bottom surface of the bit line 104 and the top surface of the write word line 102 however are not intended to be covered by the MEL 113 for a more effective induction of the magnetic field in the stack 110 during the write operation. Dummy layers (not shown) may be used in between the MEL 113 and the write word line 102 and/or the bit line 104, like for example, for the purpose of improving adhesion or for better process control.

Figure 3:
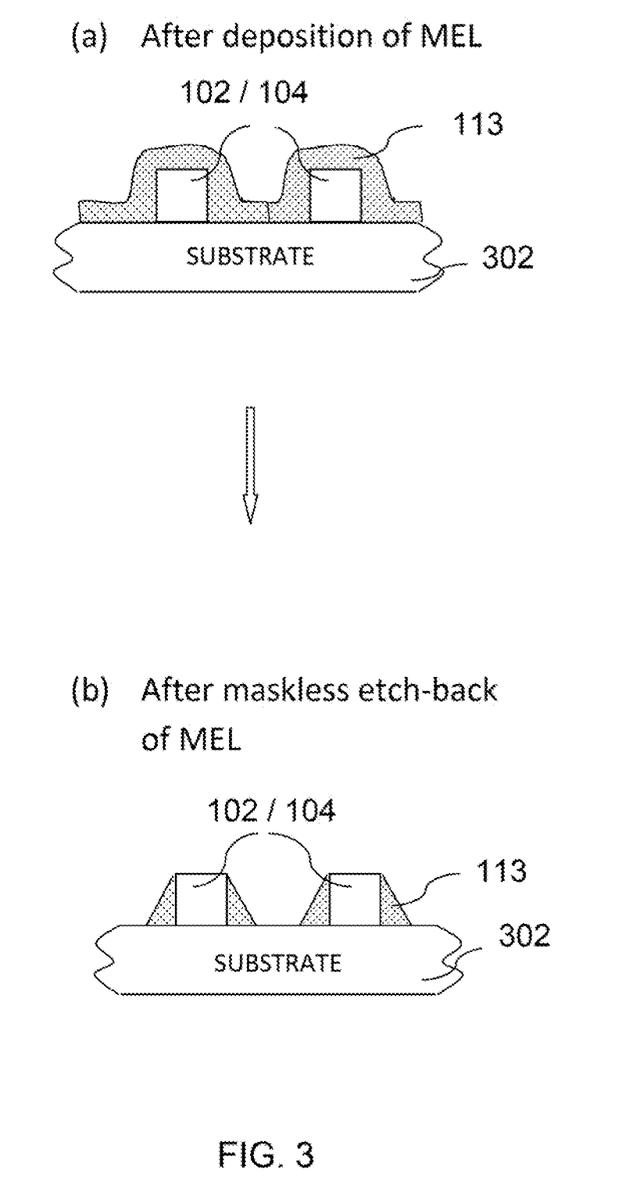
FIG. 3 illustrates a deposition and an etch-back process for defining the magnetic enhancement layer, according to an embodiment of the invention.

According to a preferred embodiment of the invention, FIG. 3 illustrates a deposition and an etch process for defining the MEL 113. Step (a) illustrates an exemplary cross-sectional view of a semi-processed substrate 302, showing two of the word lines 102 or the bit lines 104. An MEL 113 is deposited, which fully encapsulates the exposed areas of the two word lines 102 or the bit lines 104. Step (b) illustrates a subsequent step of the maskless etch-back for the MEL 113, so that the MEL 113 is retained only at the two opposite sides of the lines 102 or 104. According to an alternate embodiment (not shown), partial encapsulation is also possible, like for example when the MEL 113 as deposited is thin and the top two corners of the word lines 102 or the bit lines 104 remain exposed. This method of deposition and maskless etch-back provides good uniformity in physical dimensions and repeatability, for defining the MEL 113 on the opposite sides of the lines 102 or 104. Maskless etch-back is a known technique in the semiconductor fabrication process and is used at certain other stages of processing, like for example, for spacer formation in complementary metal-oxide-semiconductor (CMOS) processing. According to another embodiment (not shown), the deposited MEL 113 is etched through a mask to retain the MEL 113 on the two opposite sides of the word lines 102 and the bit lines 104. However, this method is unlikely to provide a process control as good as in the case of maskless etch-back. The embodiment at FIG. 2B needs process steps with selective masking to define the MEL 113 only at the crossover zones 108.

According to an embodiment, the word line 102 or the bit line 104 or both are formed with aluminum or aluminum alloy. Other metals or conductors may equally be used in other embodiments. According to an embodiment, the MEL is a stack of tantalum/nickel-iron/tantalum, wherein the nickel-iron is in any form that produces ferromagnetic properties. Use of the layers of tantalum provides better process control. According to different embodiments, ferromagnetic materials like for example iron, cobalt, iron-cobalt, and nickel-iron may be used to form the MEL 113. The iron-cobalt and nickel-iron stated here are in any form that produce suitable ferromagnetic properties, like for example, when in the form of an alloy or a composite or a compound. According to an embodiment, the word line 102 and the bit line 104 use two different ferromagnetic materials, if useful, like for example from the processing or performance considerations. According to an embodiment, the line width for the word lines 102 or the bit lines 104 may be about 180 angstroms, with about 50 angstroms wide MEL 113 on either side. However, other values may equally be used.

According to the embodiments of the invention, the MTJ stack 110 may have any kind of architecture and may use any combination of materials as necessary, to meet the required performance.

The embodiments of the invention are compatible with any semiconductor technology such as complementary metal-oxide-semiconductor (CMOS), bipolar-junction-transistor and CMOS (BiCMOS), silicon-on-insulator (SOI) and the like. The scope of the invention is also not limited to any particular technology in terms of processing sequence, materials, physical dimensions and the like.

The embodiments of the present invention may be applied to memory circuits for applications in any area, such as in automotive, mobile phone, smart card, radiation hardened military applications, database storage, Radio Frequency Identification Device (RFID), MRAM elements in field-programmable gate array (FPGA) and the like.

Although the present invention has been described with reference to specific exemplary embodiments, it will be evident that the various modification and changes can be made to these embodiments without departing from the broader spirit of the invention. Accordingly, the specification and drawings are to be regarded in an illustrative sense rather than in a restrictive sense.

The invention claimed is:

1. A magnetic memory cell comprising:
a first conductor;
a second conductor;
a magnetic storage element disposed between said two conductors; and
a magnetic enhancement layer that is disposed proximate at least along a partial length of at least one of said two conductors, for enhancing a magnetic field in said element when said two conductors are energized; wherein said magnetic enhancement layer comprises a stack of tantalum/nickel-iron/tantalum, and wherein said nickel-iron is in any form that produces ferromagnetic properties.

2. The memory cell of claim 1 wherein said first conductor is a word line and said second conductor is a bit line.

3. The memory cell of claim 1 wherein at least one of said two conductors comprises aluminum.

4. The memory cell of claim 1 wherein said magnetic enhancement layer comprises at least one of the following ferromagnetic materials:
a) iron,
b) cobalt,
c) iron-cobalt, and
d) nickel-iron,
wherein iron-cobalt and nickel-iron are in any form that produce ferromagnetic properties.

5. The memory cell of claim 4 wherein said magnetic enhancement layer comprises a first ferromagnetic material for said first conductor and a second ferromagnetic material for said second conductor.

6. A magnetic memory circuit comprising an array of memory cells of claim 1.

7. The memory circuit of claim 6 being a magnetic random access memory circuit.

8. The memory cell of claim 1 wherein said element is a magnetic tunnel junction stack.

9. The memory cell of claim 1 wherein said magnetic enhancement layer is on opposite sides of said conductor(s).

10. A magnetic random access memory circuit comprising an array of memory cells, wherein said array comprises:
a first set of word lines;
a second set of bit lines, wherein said set of bit lines overlies said set of word lines to define crossover zones;
an addressable magnetic tunnel junction stack disposed within each crossover zone; and
a magnetic enhancement layer that is disposed proximate at least along a partial length of said lines in at least one of said two sets, for enhancing a magnetic field in said magnetic tunnel junction stack when a corresponding pair of said word line and said bit line is selectively energized; wherein said magnetic enhancement layer is a stack of tantalum/nickel-iron/tantalum, wherein said nickel-iron is in any form that produces ferromagnetic properties.

11. The magnetic random access memory circuit of claim 10 wherein said lines in at least one of said two sets comprise aluminum.

12. The magnetic random access memory circuit of claim 10 wherein said magnetic enhancement layer comprises at least one of the following ferromagnetic materials:
a) iron,
b) cobalt,
c) iron-cobalt, and
d) nickel-iron,
wherein iron-cobalt and nickel-iron are in any form that produce ferromagnetic properties.

13. The magnetic random access memory circuit of claim 12, wherein said magnetic enhancement layer comprises a first ferromagnetic material for said first set and a second ferromagnetic material for said second set.

14. The magnetic random access memory circuit of claim 10 wherein said magnetic enhancement layer is on opposite sides of said lines.

15. A method of processing said memory cell according to claim 9, comprising:
depositing a magnetic enhancement layer to at least partially encapsulate either of said two conductors; and masklessly etching back said magnetic enhancement layer while retaining said magnetic enhancement layer only at said two opposite sides.

16. A method of processing said magnetic random access memory circuit according to claim 14, comprising:
depositing a magnetic enhancement layer to at least partially encapsulate either of said word and bit lines; and
masklessly etching back said magnetic enhancement layer while retaining said magnetic enhancement layer only at said two opposite sides.

17. A method of operating a magnetic memory cell comprising a magnetic storage element disposed between two conductors, said method comprising:
enhancing a magnetic field that is induced in said element when said two conductors are energized, said enhancing being by using a magnetic enhancement layer that is disposed proximate at least along a partial length of at least one of said two conductors; wherein said magnetic enhancement layer comprises a stack of tantalum/nickel-iron/tantalum, and wherein said nickel-iron is in any form that produces ferromagnetic properties.

18. A method of operating a magnetic random access memory circuit comprising a first set of bit lines overlying a second set of word lines to define crossover zones and a magnetic tunnel junction stack being disposed within each crossover zone, said method comprising:
enhancing a magnetic field that is induced in each said magnetic tunnel junction stack when a corresponding pair of said word line and said bit line is selectively energized, said enhancing being by using a magnetic enhancement layer that is disposed proximate at least along a partial length of said lines in at least one of said two sets; wherein said magnetic enhancement layer comprises a stack of tantalum/nickel-iron/tantalum, and wherein said nickel-iron is in any form that produces ferromagnetic properties.

* * * * *